(12) United States Patent
Liu et al.

(10) Patent No.: US 11,852,659 B2
(45) Date of Patent: Dec. 26, 2023

(54) CURRENT DETECTION DEVICE

(71) Applicants: Kabushiki Kaisha Toshiba, Tokyo (JP); Toshiba Electronic Devices & Storage Corporation, Tokyo (JP)

(72) Inventors: Jia Liu, Yokohama (JP); Yasuyuki Fujiwara, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 27 days.

(21) Appl. No.: 17/652,321

(22) Filed: Feb. 24, 2022

(65) Prior Publication Data

US 2023/0078354 A1 Mar. 16, 2023

(30) Foreign Application Priority Data

Sep. 16, 2021 (JP) .................................. 2021-151242

(51) Int. Cl.
*G01R 15/20* (2006.01)
*G01R 19/00* (2006.01)

(52) U.S. Cl.
CPC ....... *G01R 15/202* (2013.01); *G01R 19/0092* (2013.01)

(58) Field of Classification Search
CPC .......................... G01R 19/0092; G01R 15/202
See application file for complete search history.

(56) References Cited

U.S. PATENT DOCUMENTS

| 6,759,841 | B2* | 7/2004 | Goto | G01R 15/202 |
|---|---|---|---|---|
| | | | | 324/251 |
| 9,958,482 | B1* | 5/2018 | Latham | G01R 15/205 |
| 11,162,982 | B2 | 11/2021 | Liu et al. | |
| 11,366,141 | B1* | 6/2022 | Daubert | G01R 19/14 |
| 2007/0025028 | A1* | 2/2007 | Chung | G01R 33/098 |
| | | | | 360/324.2 |
| 2015/0160272 | A1* | 6/2015 | Juds | H01H 33/027 |
| | | | | 324/244 |

(Continued)

FOREIGN PATENT DOCUMENTS

| JP | 09-318672 A | 12/1997 |
|---|---|---|
| JP | 3094635 B2 | 10/2000 |

(Continued)

*Primary Examiner* — Dominic E Hawkins
(74) *Attorney, Agent, or Firm* — Allen & Overy LLP

(57) ABSTRACT

A current detection device of an embodiment includes a conductor, a first magnetic field detector, a second magnetic field detector, and a conductive film. The conductor includes a first region, a second region, and a third region connecting an edge of the first region and an edge of the second region. The first magnetic field detector is disposed between the first and second regions. The second magnetic field detector is disposed opposite to the first magnetic field detector with respect to the third region. The conductive film is bonded to a conductor layer including a slit having a width larger than each of widths of magneto-sensitive parts of the first and second magnetic field detectors and covers the slit, the conductor layer being provided between the conductor and each of the first and second magnetic field detectors.

6 Claims, 4 Drawing Sheets

(56) References Cited

U.S. PATENT DOCUMENTS

| | | | |
|---|---|---|---|
| 2018/0038898 A1* | 2/2018 | Shimizu | G01R 33/07 |
| 2020/0011902 A1* | 1/2020 | Shimizu | G01R 19/0092 |
| 2021/0190832 A1 | 6/2021 | Liu | |
| 2022/0091161 A1* | 3/2022 | Houis | G01R 15/207 |

FOREIGN PATENT DOCUMENTS

| | | | |
|---|---|---|---|
| JP | 2001-339109 | A | 12/2001 |
| JP | 2013-142623 | A | 7/2013 |
| JP | 2014-066623 | A | 4/2014 |
| JP | 6533101 | B2 | 6/2019 |
| JP | 2020-085853 | A | 6/2020 |
| JP | 2021-096212 | A | 6/2021 |

* cited by examiner

CURRENT DETECTION DEVICE

CROSS-REFERENCE TO RELATED APPLICATIONS

This application is based upon and claims the benefit of priority from the prior Japanese Patent Application No. 2021-151242 filed on Sep. 16, 2021; the entire contents of which are incorporated herein by reference.

FIELD

Embodiments described herein relate generally to a current detection device.

BACKGROUND

A current detection device detects detection target current by causing the current to flow through a conductor such as a coil and detecting a magnetic field generated by the conductor. The generated magnetic field is detected by a magnetic field sensor such as a Hall sensor. A structure in which a shield layer (shield sheet) is provided between the conductor and the magnetic field sensor to achieve high performance and reliable operation of the current detection device is publicly known.

DETAILED DESCRIPTION

Figure 1:
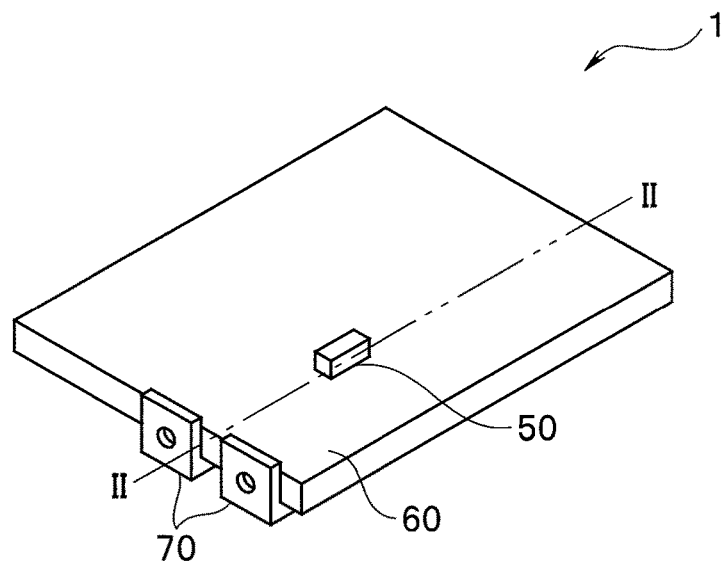
FIG. 1 is an entire configuration diagram of a current detection device according to a first embodiment.

A current detection device of an embodiment includes a conductor, a first magnetic field detector, a second magnetic field detector, and a conductive film. The conductor includes a first region, a second region, and a third region connecting an edge of the first region and an edge of the second region. The first magnetic field detector is disposed between the first and second regions. The second magnetic field detector is disposed opposite to the first magnetic field detector with respect to the third region. The conductive film is bonded to a conductor layer including a slit having a width larger than each of widths of magneto-sensitive parts of the first and second magnetic field detectors and provided between the conductor and each of the first and second magnetic field detectors, and covers the slit.

Embodiments will be described below in detail with reference to the accompanying drawings.

Note that in the drawings based on the embodiments, which are schematic, a relation between a thickness and a width of each component, a thickness ratio and a relative angle of parts, and the like are different from reality. A dimensional relation and a ratio of some parts included in drawings are different between the drawings. Illustration and reference sign provision of some constituent components are omitted.

FIRST EMBODIMENT

Figure 2:
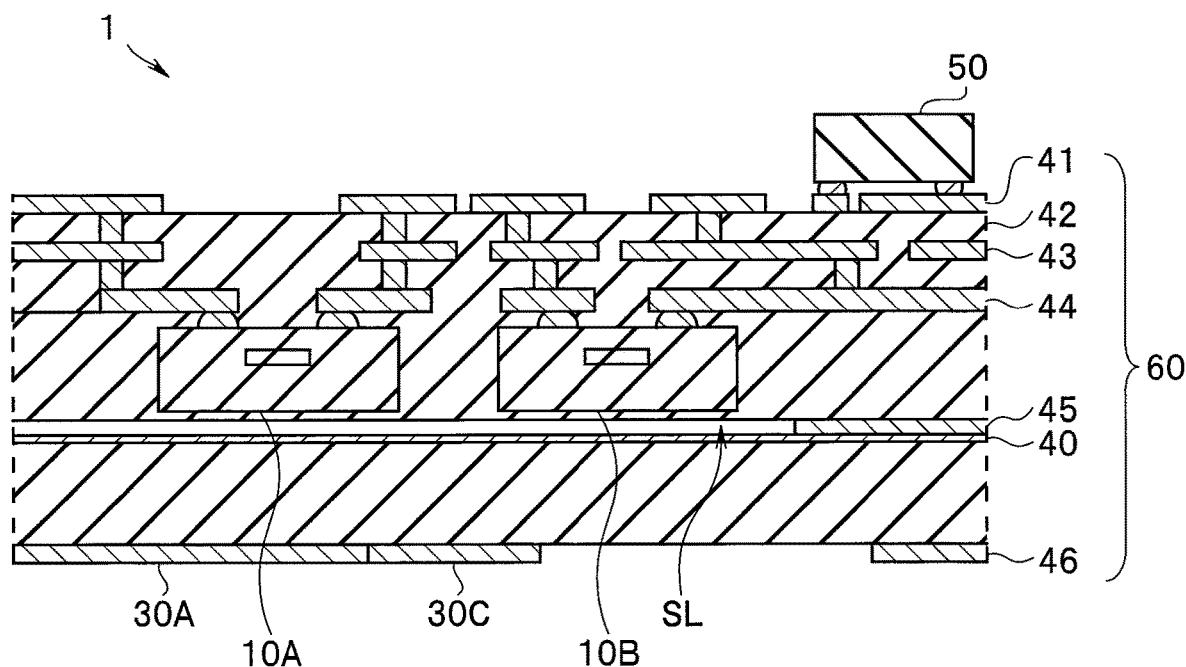
FIG. 2 is a cross-sectional view of the current detection device, which is taken along line II-II in FIG. 1.
Figure 3:
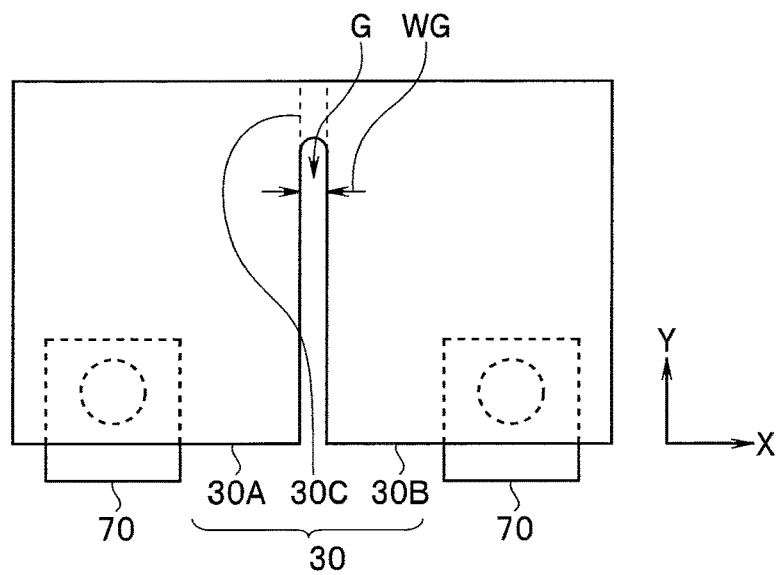
FIG. 3 is a diagram for description of a configuration of a conductor 30.
Figure 4:
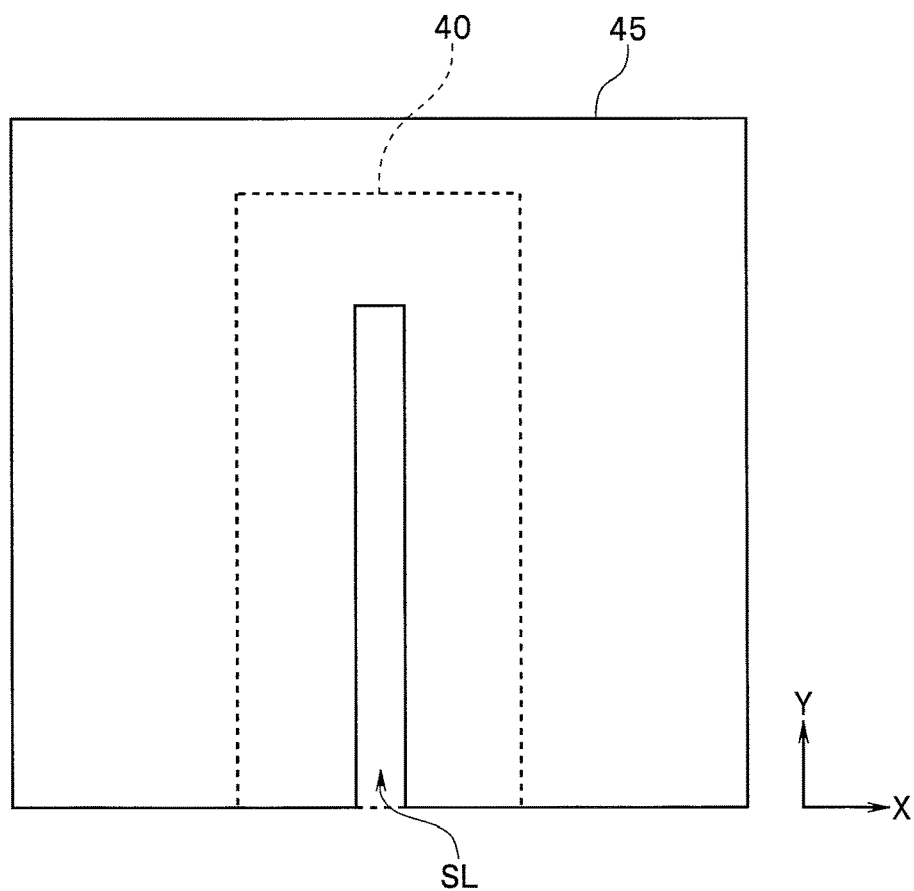
FIG. 4 is a diagram for description of configurations of a conductor layer 45 and an evaporation coating film 40.
Figure 5:
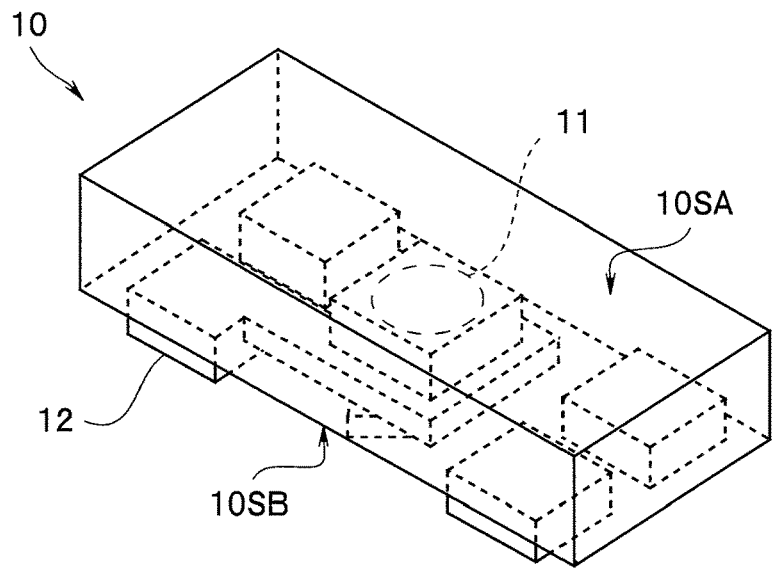
FIG. 5 is a perspective view of a magnetic field sensor.
Figure 6:
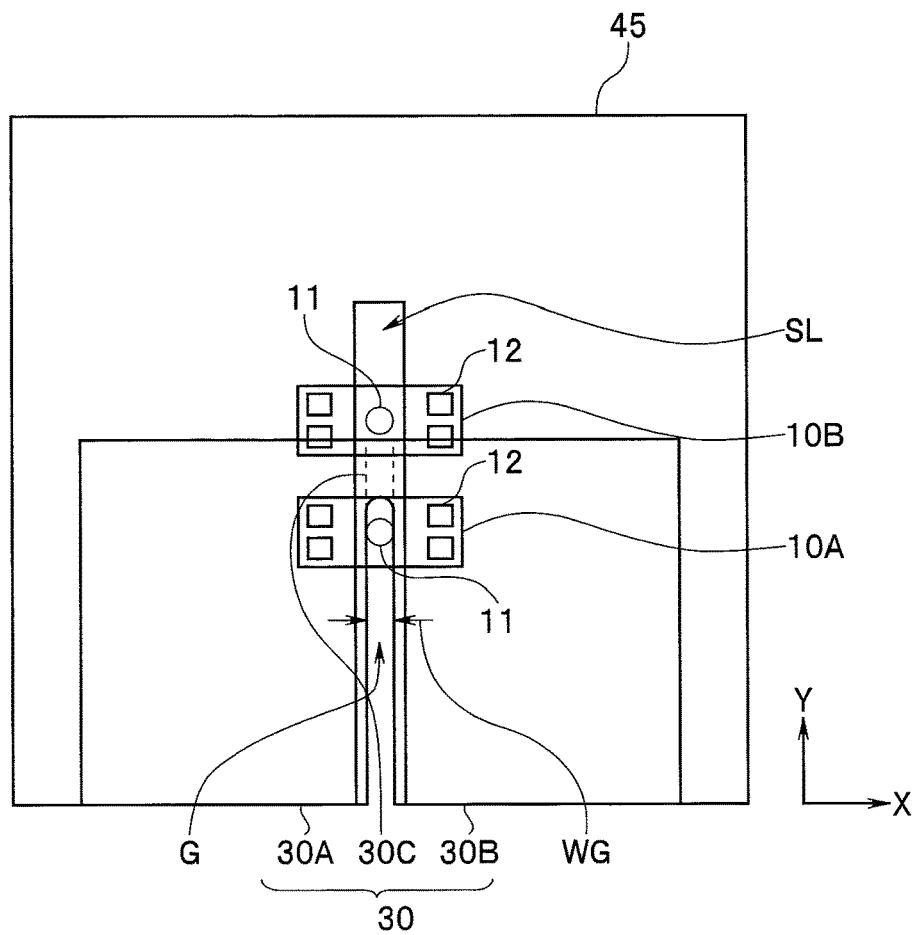
FIG. 6 is a diagram for description of a disposition relation among the conductor 30, the conductor layer 45, and magnetic field sensors 10A and 10B.

FIG. 1 is an entire configuration diagram of a current detection device according to a first embodiment. FIG. 2 is a cross-sectional view of the current detection device, which is taken along line II-II in FIG. 1. FIG. 3 is a diagram for description of a configuration of a conductor 30. FIG. 4 is a diagram for description of configurations of a conductor layer 45 and an evaporation coating film 40. FIG. 5 is a perspective view of a magnetic field sensor. FIG. 6 is a diagram for description of a disposition relation among the conductor 30, the conductor layer 45, and magnetic field sensors 10A and 10B.

A current detection device 1 is constituted by a multi-layer wiring plate 60 including a plurality of conductor layers (for example, 41, 43, 44, 45, and 46) and a plurality of insulating layers (for example, 42). The multi-layer wiring plate 60 is connected to a connector 70 configured to supply current to the conductor 30. Note that the multi-layer wiring plate 60 may be a wiring plate stacked on one substrate or may be a wiring plate formed by bonding a plurality of substrates. The multi-layer wiring plate 60 has a rectangular shape but is not limited to a rectangular shape and may have another shape such as a circular shape.

The current detection device 1 detects current flowing to the conductor 30. Current to be detected is direct current or alternating current. The current detection device 1 of the present embodiment is used for, for example, overcurrent protection of a high-frequency switching power source, an AC/DC adapter, or a control device of a general-purpose inverter or a motor variable speed instrument, or a power module.

At least one electronic component 50, for example, an IC chip is mounted on the surface of the conductor layer 41. The electronic component 50 includes, for example, an amplifier circuit configured to amplify a voltage signal in accordance with a magnetic field detected by a first magnetic field sensor 10A and/or a second magnetic field sensor 10B. Note that the electronic component 50 may be built in the multi-layer wiring plate 60. In the following description, the first magnetic field sensor 10A and the second magnetic field sensor 10B are simply referred to as a magnetic field sensor 10 when collectively described.

The conductor layer 43 is a ground layer connected to the conductor layer 41 and the conductor layer 44 through a contact hole.

Part of the conductor layer 46 is constituted by the conductor 30 to which current is applied through the connector 70. As illustrated in FIG. 3, the conductor 30 has a U shape including a first region 30A, a second region 30B, and a third region 30C connecting an edge of the first region 30A and an edge of the second region 30B. The connector 70, through which current flows in, is disposed at an end part of each of the first region 30A and the second region 30B, which are both substantially rectangular. The first region 30A and the second region 30B are disposed opposite to each other through a gap G. An interval WG of the gap G is a length of a current flow path of the third region 30C.

The conductor layer 45 is a ground layer including a slit SL as illustrated in FIG. 4. The slit SL has a sufficient length in a Y direction. Specifically, as illustrated in FIG. 6, the length of the slit SL in the Y direction is longer than a length of the gap G in the Y direction. The width of the slit SL is larger than a diameter of a magneto-sensitive part 11 of the magnetic field sensor 10 and smaller than distance between two external electrodes 12 between which the magneto-sensitive part 11 of the magnetic field sensor 10 is sandwiched. It is possible to decrease a high-frequency gain of a band characteristic, reduce generation of eddy current, and stabilize voltage output of the magnetic field sensor 10 by increasing the length of the slit SL in the Y direction.

The evaporation coating film 40 is bonded to the conductor layer 45. The evaporation coating film 40 serves as a conductive film. Specifically, the first magnetic field sensor 10A and/or the second magnetic field sensor 10B, or the evaporation coating film 40 for preventing electrostatic noise from entering the first magnetic field sensor 10A and/or the second magnetic field sensor 10B is bonded to the conductor layer 45 between the conductor layer 44, on which the first magnetic field sensor 10A and the second magnetic field sensor 10B are mounted, and the conductor layer 46 included in the conductor 30, and covers the slit SL. The evaporation coating film 40 is essential for noise reduction but generates eddy current at high frequency and thus needs to be formed extremely thin and has, for example, a thickness of tens of nanometers.

A surface of the evaporation coating film 40 is entirely bonded by soldering, the surface contacting the conductor layer 45. Specifically, contact resistance between the evaporation coating film 40 and the conductor layer 45 is decreased by increasing contact area of the evaporation coating film 40 and the conductor layer 45 as a ground layer. Note that the evaporation coating film 40 is not limited to bonding to the conductor layer 45 by soldering but may be bonded to the conductor layer 45 by, for example, clamping. Material of the evaporation coating film 40 is aluminum. Note that the material of the evaporation coating film 40 is not limited to aluminum but may be any conductive material such as copper.

Lengths of the evaporation coating film 40 in an X direction and the Y direction are sufficiently larger than lengths of the slit SL of the conductor layer 45 in the X and Y directions. Accordingly, bonding area of the evaporation coating film 40 and the conductor layer 45 is increased so that the evaporation coating film 40 sufficiently functions as a shield.

The first and second magnetic field sensors 10A and 10B are mounted on the conductor layer 44. The first and second magnetic field sensors 10A and 10B serving as first and second magnetic field detection elements (first and second magnetic field detectors) are Hall sensors configured to detect current flowing through the conductor 30. As illustrated in FIG. 5, the magnetic field sensor 10 has a lower surface 10SB provided with four external electrodes 12, and an upper surface 10SA opposite to the lower surface 10SB. Current to be detected is input to two of the four external electrodes 12, and an output signal (hole voltage) is output from the other two external electrodes 12.

The first and second magnetic field sensors 10A and 10B are mounted on a surface (in FIG. 2, lower surface) of the conductor layer 44, the surface being closer to the conductor 30. Accordingly, a magnetic field stronger than in a case in which the first and second magnetic field sensors 10A and 10B are mounted on an upper surface of the conductor layer 44 is applied to the first and second magnetic field sensors 10A and 10B.

The magneto-sensitive part (magneto-sensitive region) 11 is a sensor capable of sensing generated magnetic flux. As illustrated in FIG. 6, the magneto-sensitive part 11 of the first magnetic field sensor 10A is disposed on the gap G between the first region 30A and the second region 30B. The magneto-sensitive part 11 of the second magnetic field sensor 10B is disposed at an outer periphery of the third region 30C. Specifically, the magneto-sensitive part 11 of the magnetic field sensor 10 (10A, 10B) does not overlap the conductor 30 when viewed in a direction parallel to a direction in which the conductor 30 and the first magnetic field sensor 10A are stacked or a direction in which the conductor 30 and the second magnetic field sensor 10B are stacked.

With such disposition, a magnetic field detected by the second magnetic field sensor 10B is weaker than a magnetic field detected by the first magnetic field sensor 10A. Thus, a voltage signal in accordance with the magnetic field detected by the second magnetic field sensor 10B is amplified by the amplifier circuit included in the electronic component 50.

The interval WG between the first region 30A and the second region 30B is preferably substantially equal to a size (outer diameter) of the magneto-sensitive part 11 so that the first magnetic field sensor 10A can more highly sensitively detect a magnetic field. For example, the interval WG is preferably 90% to 120% inclusive of the size of the magneto-sensitive part 11.

In the current detection device 1 with the above-described configuration, the slit SL is provided to the conductor layer 45 as a ground layer between the conductor layer 44, on which the first and second magnetic field sensors 10A and 10B are mounted, and the conductor layer 46 included in the conductor 30, and the evaporation coating film 40 for noise reduction, which is extremely thin, is bonded to the conductor layer 45 to cover the slit SL. Accordingly, the current detection device 1 has both band and CMRR characteristics and improved sensitivity.

SECOND EMBODIMENT

Subsequently, a second embodiment will be described below.

Although the magnetic field sensors 10A and 10B are mounted inside the multi-layer wiring plate 60 in the first embodiment, the magnetic field sensors 10A and 10B are mounted on a surface of the multi-layer wiring plate 60 in the second embodiment.

Figure 7:
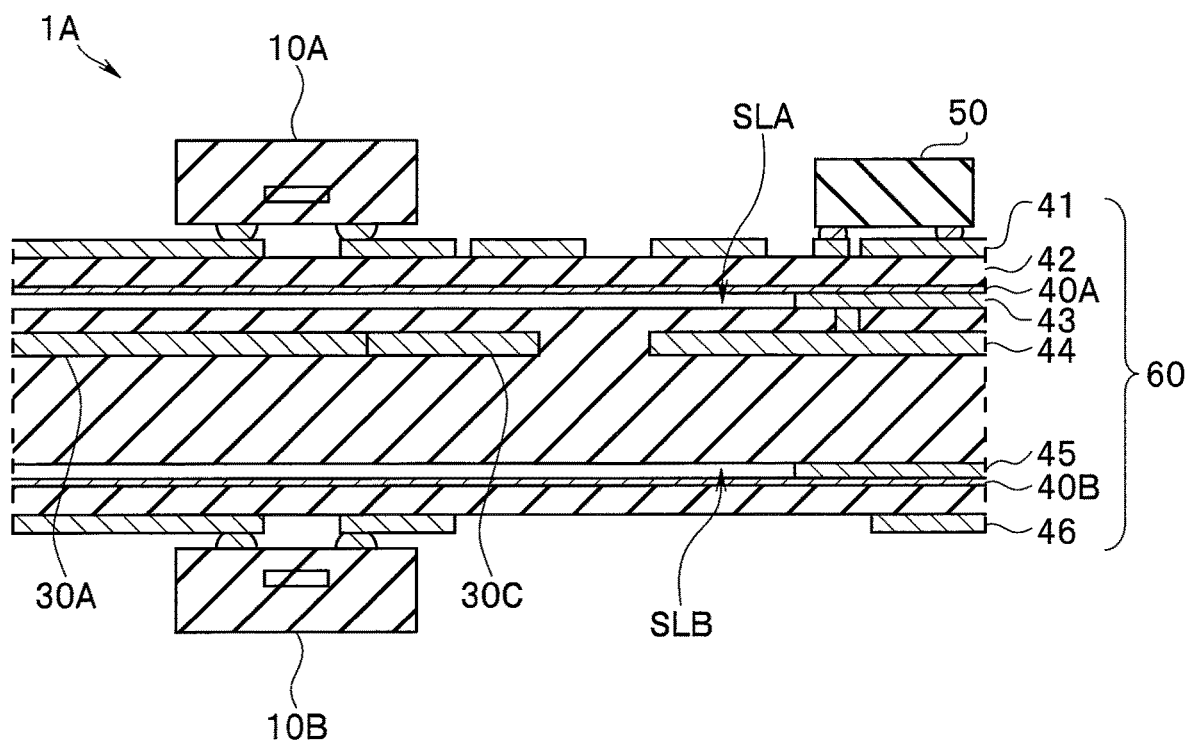
FIG. 7 is a cross-sectional view of a current detection device according to a second embodiment.

FIG. 7 is a cross-sectional view of a current detection device according to the second embodiment. As illustrated in FIG. 7, in this current detection device 1A, the first magnetic field sensor 10A is mounted on a surface of the conductor layer 41, and the second magnetic field sensor 10B is mounted on a surface of the conductor layer 46. The conductor 30 constitutes part of the conductor layer 44. Specifically, the conductor 30 is disposed between the first magnetic field sensor 10A and the second magnetic field sensor 10B.

The conductor layer 43 includes a first slit SLA having a width larger than a diameter of the magneto-sensitive part 11 of the magnetic field sensor 10 and smaller than the distance between the two external electrodes 12 between which the magneto-sensitive part 11 of the magnetic field sensor 10 is sandwiched.

The conductor layer 45 includes a second slit SLB having a width larger than the diameter of the magneto-sensitive part 11 of the magnetic field sensor 10 and smaller than the distance between the two external electrodes 12 between which the magneto-sensitive part 11 of the magnetic field sensor 10 is sandwiched.

A first evaporation coating film 40A for preventing electrostatic noise from entering the first magnetic field sensor 10A is bonded to the conductor layer 43 between the conductor layer 41, on which the first magnetic field sensor 10A is mounted, and the conductor layer 44 included in the conductor 30, and covers the first slit SLA. The first evaporation coating film 40A serves as a first conductive film.

In addition, a second evaporation coating film 40B for preventing electrostatic noise from entering the second magnetic field sensor 10B is bonded to the conductor layer 45 between the conductor layer 46, on which the second magnetic field sensor 10B is mounted, and the conductor layer 44 included in the conductor 30, and covers the second slit SLB. The second evaporation coating film 40B serves as a second conductive film.

The first magnetic field sensor 10A and the second magnetic field sensor 10B are disposed opposite to each other with respect to the conductor 30. The magneto-sensitive part 11 of the first magnetic field sensor 10A is disposed on the gap G between the first region 30A and the second region 30B. Since the first magnetic field sensor 10A and the second magnetic field sensor 10B are disposed opposite to each other with respect to the conductor 30, the magneto-sensitive part 11 of the second magnetic field sensor 10B is also disposed on the gap G between the first region 30A and the second region 30B.

With such a configuration, the first magnetic field sensor 10A and the second magnetic field sensor 10B can equivalently sense a magnetic field (magnetic flux density) generated by current flowing through the conductor 30. Thus, in the current detection device 1A, voltage in accordance with the magnetic field (magnetic flux density) sensed by the first magnetic field sensor 10A and/or the second magnetic field sensor 10B does not need to be adjusted by an amplifier circuit.

As a result, the current detection device 1A of the second embodiment can omit the amplifier circuit included in the electronic component 50 in the current detection device 1 of the first embodiment, thereby achieving manufacturing cost lower than manufacturing cost of the current detection device 1 of the first embodiment.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A current detection device comprising:
    a conductor including a first region, a second region, and a third region connecting an edge of the first region and an edge of the second region;
    a first magnetic field detector disposed between the first and second regions;
    a second magnetic field detector disposed opposite to the first magnetic field detector with respect to the third region; and
    a conductive film bonded to a conductor layer including a slit having a width larger than each of widths of magneto-sensitive parts of the first and second magnetic field detectors, the conductive film covering the slit, the conductor layer being provided between the conductor and each of the first and second magnetic field detectors, wherein
    the magneto-sensitive parts of the first and second magnetic field detectors are disposed in the slit.

2. The current detection device according to claim 1, wherein the width of the slit is larger than each of diameters of the magneto-sensitive parts of the first and second magnetic field detectors and smaller than distance between two external electrodes between which one of the magneto-sensitive parts of the first and second magnetic field detectors is sandwiched.

3. The current detection device according to claim 1, wherein a surface of the conductive film is entirely connected by soldering or clamping, the surface contacting the conductor layer.

4. The current detection device according to claim 1, wherein the conductive film prevents electrostatic noise from entering the first and second magnetic field detectors.

5. The current detection device according to claim 1, further comprising an amplification circuit configured to amplify a voltage signal detected by the first and/or the second magnetic field detector.

6. A current detection device comprising:
    a conductor including a first region, a second region, and a third region connecting an edge of the first region and an edge of the second region;
    a first magnetic field detector disposed between the first and second regions;
    a second magnetic field detector disposed opposite to the first magnetic field detector with respect to the conductor;
    a first conductive film bonded to a first conductor layer including a first slit having a width larger than each of widths of magneto-sensitive parts of the first and second magnetic field detectors, the first conductive film covering the first slit, the first conductor layer being provided between the conductor and the first magnetic field detector; and
    a second conductive film bonded to a second conductor layer including a second slit having a width larger than each of the widths of magneto-sensitive parts of the first and second magnetic field detectors, the second conductive film covering the second slit, the second conductor layer being provided between the conductor and the second magnetic field detector.

* * * * *